(12) United States Patent
Okahisa

(10) Patent No.: US 7,481,881 B2
(45) Date of Patent: Jan. 27, 2009

(54) METHOD OF MANUFACTURING GAN CRYSTAL SUBSTRATE

(75) Inventor: Takuji Okahisa, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 261 days.

(21) Appl. No.: 10/905,768

(22) Filed: Jan. 20, 2005

(65) Prior Publication Data
US 2005/0155544 A1    Jul. 21, 2005

(30) Foreign Application Priority Data
Jan. 21, 2004   (JP)   ............... 2004-013345

(51) Int. Cl.
*C30B 23/00*   (2006.01)
*C30B 29/40*   (2006.01)

(52) U.S. Cl. .............. 117/91; 117/84; 117/88; 117/99; 117/101; 117/952

(58) Field of Classification Search .......... 117/84, 117/88, 91, 99, 101, 952
See application file for complete search history.

(56) References Cited

U.S. PATENT DOCUMENTS
6,468,347 B1 *   10/2002   Motoki et al. ............ 117/89
2003/0080345 A1 *   5/2003   Motoki et al. ............ 257/103
2005/0103257 A1 *   5/2005   Xu et al. ................ 117/84

FOREIGN PATENT DOCUMENTS
| EP | 1041610 A1 * | 10/2000 |
| JP | H10-312971 A | 11/1998 |
| JP | 2001-102307 A | 4/2001 |
| JP | 2003-055099 A | 2/2003 |
| JP | 2003-165799 A | 6/2003 |

* cited by examiner

*Primary Examiner*—Robert M Kunemund
*Assistant Examiner*—Matthew J Song
(74) *Attorney, Agent, or Firm*—James W. Judge

(57) ABSTRACT

Affords a method of manufacturing GaN crystal substrate in which enlargement of pit size in the growing of GaN crystal is inhibited to enable GaN crystal substrate with a high substrate-acquisition rate to be produced. The method of manufacturing GaN crystal substrate includes a step of growing GaN crystal (4) by a vapor growth technique onto a growth substrate (1), the GaN-crystal-substrate manufacturing method being characterized in that in the step of growing the GaN crystal (4), pits (6) that define facet planes (5F) are formed in the crystal-growth surface, and being characterized by having the pit-size increase factor of the pits (6) be 20% or less.

2 Claims, 4 Drawing Sheets

METHOD OF MANUFACTURING GAN CRYSTAL SUBSTRATE

BACKGROUND OF THE INVENTION

1. Field of the Invention

The present invention relates to methods of manufacturing GaN monocrystalline substrates used in light-emitting devices, such as light-emitting diodes (LEDs) and laser diodes (LDs), made from Group III-V semiconductor compounds.

2. Description of the Background Art

As a way of manufacturing large-scale, low-dislocation-density GaN-crystal thick films for application as substrates in LEDs, LDs and other light-emitting devices made from Group III-V semiconductor compounds, one method that has been proposed is, when growing GaN crystal onto a base substrate using a vapor growth technique, to form in the crystal-growth surface pits that define facet planes and to confine the dislocations to, or quench the dislocations along, the boundary lines of the facet planes of the pits, to grow GaN substrates of large area and slight dislocation density. (Cf. Japanese Unexamined Pat. App. Pub. No. 2001-102307, for example.)

A problem with this pit-employing method of manufacturing GaN crystal substrates, however, has been that along with the GaN crystal growth the pits grow too, enlarging diametrically, which lessens the effective GaN crystal portion that can be obtained by separating off the grown GaN crystal in thin, platelike form.

SUMMARY OF THE INVENTION

In view of the foregoing circumstances, an object of the present invention is to make available a method of manufacturing GaN crystal substrate that efficiently yields a great amount GaN crystal substrate (that is, in which the substrate-acquisition rate is high) by, in the growing of GaN crystal, inhibiting enlargement of pit size to increase the effective GaN crystal portion in which the grown GaN crystal, separated off in thin, platelike form, is usable as a GaN crystal substrate.

In order to address the foregoing objective, the present invention is a method of manufacturing GaN crystal substrate that includes a step of growing GaN crystal by a vapor growth technique onto a base (growth) substrate, the GaN-crystal-substrate manufacturing method being characterized in that in the step of growing GaN crystal, facet-plane-defining pits are formed in the crystal-growth surface, and being characterized by having the pit-size increase factor of the pits be 20% or less.

In addition, the present invention is a method of manufacturing GaN crystal substrate that includes a step of forming an aperture-window-defining mask layer onto a growth substrate, and a step of growing GaN crystal by a vapor growth technique onto the mask layer, the GaN-crystal-substrate manufacturing method being characterized in that facet-plane-defining pits are formed in the crystal-growth surface, and being characterized by having the pit-size increase factor of the pits be 20% or less.

In a GaN-crystal-substrate manufacturing method involving the present invention, it is preferable that, in the step of growing GaN crystal, the temperature at which the GaN crystal is grown be 1000° C. or less.

As set forth above, the present invention affords a method of manufacturing GaN crystal substrate in which enlargement of pit size in the growing of GaN crystal is inhibited to enable GaN crystal substrate with a high substrate-acquisition rate to be produced.

From the following detailed description in conjunction with the accompanying drawings, the foregoing and other objects, features, aspects and advantages of the present invention will become readily apparent to those skilled in the art.

DETAILED DESCRIPTION OF THE INVENTION

Figure 1:
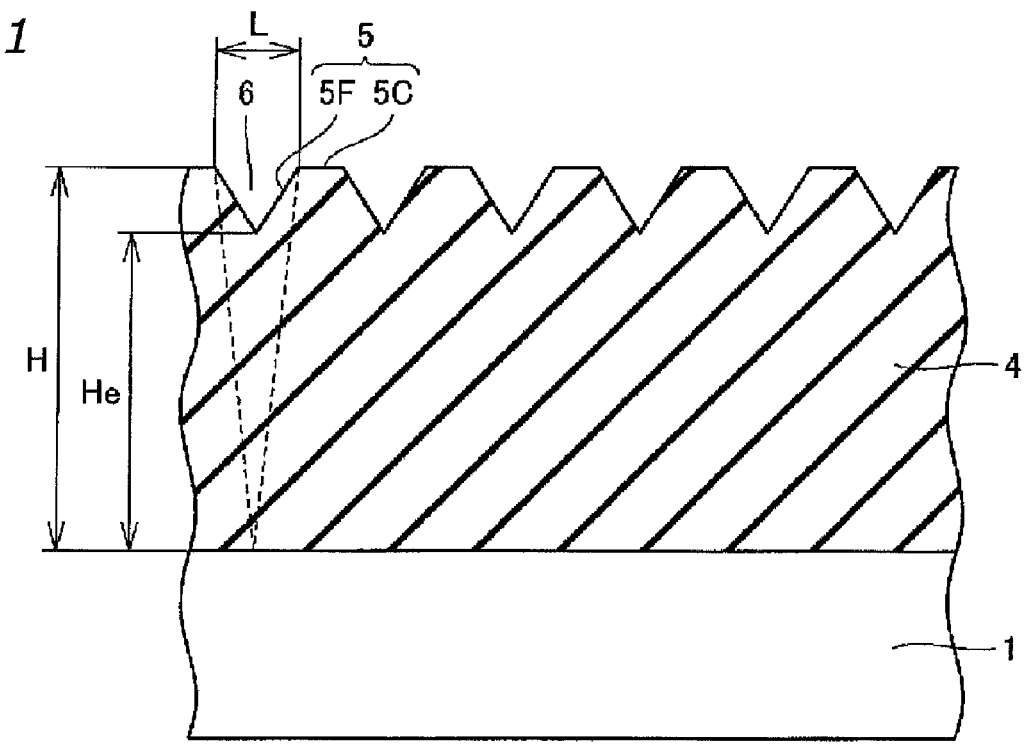
FIG. 1 is a schematic cross-sectional view illustrating one method, in accordance with the present invention, of manufacturing a GaN crystal substrate.

Reference is made to FIG. 1, to illustrate a method of manufacturing a GaN crystal substrate according to the present invention. The GaN-crystal-substrate manufacturing a method includes a step of growing a GaN crystal 4 on a base (growth) substrate 1 by a vapor growth technique. In the step of growing the GaN crystal 4, pits 6 are formed in a crystal growth face 4A, each pit defining facet planes 5F, and the pit-size increase factor of the pits 6 is made to be 20% or less. By restricting the pit-size increase factor to 20% or less, the pit size is prevented from increasing even when the thickness of the GaN crystal is considerable. This result increases the usable thickness He (μm) of the GaN crystal, which is the thickness of the GaN crystal that can be separated off as a GaN crystal substrate when the GaN crystal is grown to a thickness H (μm), thus improving the substrate acquisition rate—the proportion of usable GaN crystal available from the grown GaN crystal.

Preferable examples of the base substrate herein include, although they are not particularly limited to, a GaN substrate, which is a native substrate that is free from lattice mismatches with the GaN crystal, and foreign substrates that have small lattice mismatches, such as GaAs substrates, sapphire substrates, and SiC substrates. The base substrate is not limited to one with a single layer construction; a base substrate on which a GaN layer is formed on a sapphire substrate or SiC substrate, which are foreign substrates, may also be used as a native substrate.

Figure 2:
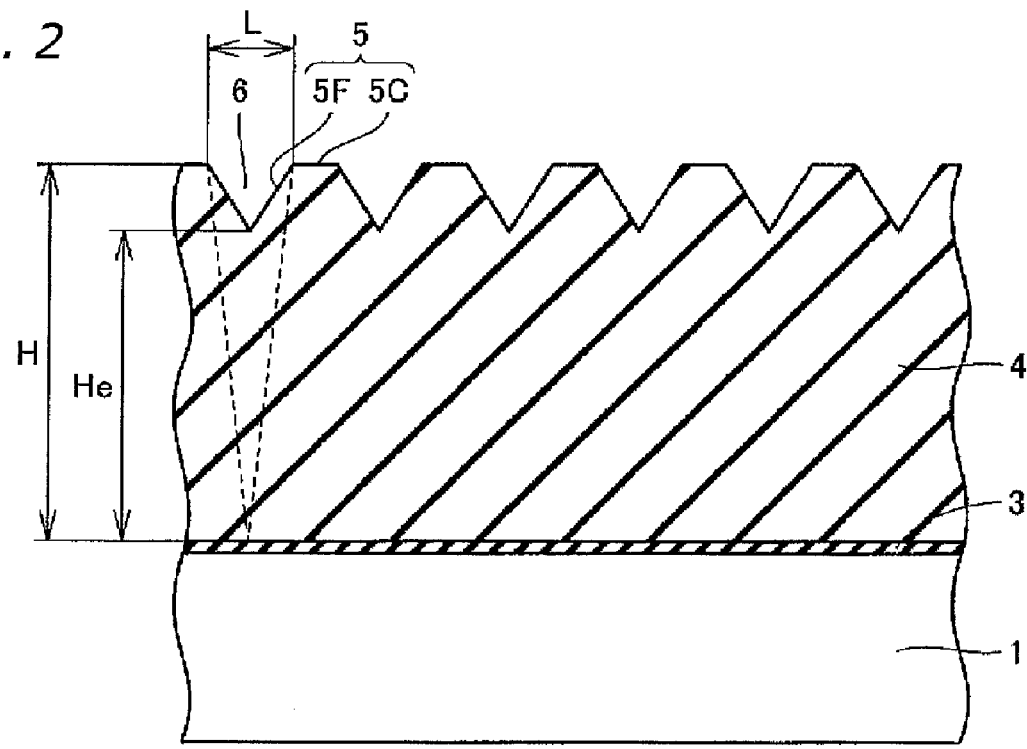
FIG. 2 is a schematic cross-sectional view illustrating another method, in accordance with the present invention, of manufacturing a GaN crystal substrate.

Referring to FIG. 2, when using a foreign substrate such as a sapphire substrate or a SiC substrate as the growth substrate, it is preferable, in the step of growing a GaN crystal on the growth substrate 1 by a vapor growth technique, to initially form by vapor deposition on the growth substrate 1 a GaN buffer layer 3 that is an amorphous layer of GaN, and thereafter grow a GaN crystal 4 on the GaN buffer layer 3 by vapor deposition in order to alleviate lattice mismatches and reduce the dislocation density of the GaN crystal.

Examples of vapor phase deposition techniques include, but are not particularly limited to, techniques such as HVPE (hydride vapor phase epitaxy), MOCVD (metal-organic chemical vapor deposition), MOC (metal-organic chloride vapor phase epitaxy), and sublimation. Among these, HVPE, which has a high growth rate, is preferable for obtaining a GaN substrate with considerable thickness.

The term "facet plane" refers to a plane other than the plane that is perpendicular to the crystal growth orientation (growth surface). Herein, the c-plane 5C is the growth surface since the crystal growth takes place along the c-axis orientation, and the facet planes are those planes other than the c-plane. GaN crystal has a hexagonal structure, so the c-plane, which is the growth surface, is represented as (0001). In the GaN crystal, the facet planes that appear frequently are the $\{1\bar{2}12\}$, $\{1\bar{2}11\}$, $\{n\bar{2}nnk\}$ (where n and k are integers), $\{1\bar{1}01\}$, $\{1\bar{1}02\}$, and $\{n\bar{n}0k\}$ (where n and k are integers) planes; among them, the $\{1\bar{2}12\}$ plane is a representative example of the facet plane. It should be noted that the notations such as $\{1\bar{2}12\}$ are used collectively; for example, the $\{1\bar{2}12\}$ planes include six different planes: the $(1\bar{2}12)$ plane, the $(2\bar{1}\bar{1}2)$ plane, the $(11\bar{2}2)$ plane, the $(\bar{1}2\bar{1}2)$ plane, the $(\bar{2}112)$ plane, and the $(\bar{1}\bar{1}22)$ plane.

Figure 6:
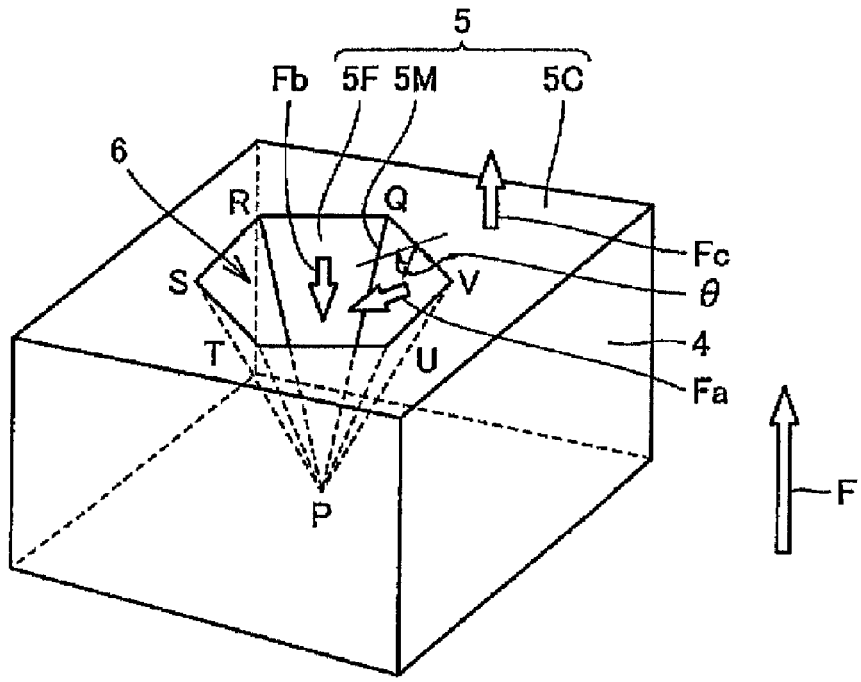
FIG. 6 is a three-dimensional schematic view illustrating pits on a GaN crystal.
Figure 7:
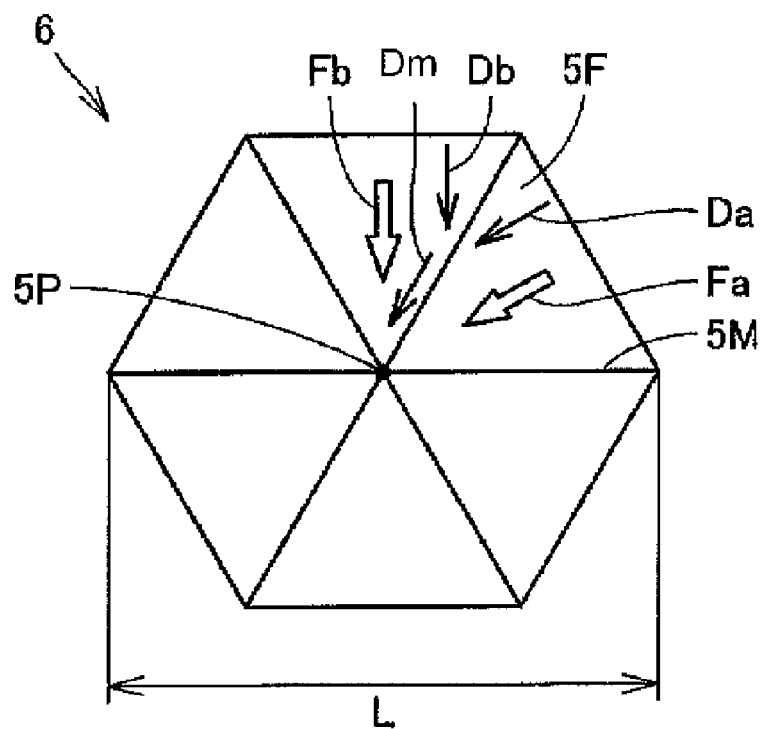
FIG. 7 is a schematic plan view illustrating pits on a GaN crystal, viewed from above.

The reason why the crystal dislocation density is reduced by forming facet-plane-defining pits in the crystal growth surface and carrying out crystal growth will be explained. With reference to FIG. 6, a case is assumed in which, in growing a GaN crystal, a pit 6 of an inverted hexagonal pyramid QRSTUV-P geometry having the $\{1\bar{2}12\}$ plane as a facet plane 5F is formed in the crystal growth surface 5. GaN crystal-growth directions $F_a$ and $F_b$, and dislocation-advancing directions $D_a$ and $D_b$, in the facet plane 5F are directions that are the normals to the facet planes having been projected on the bottom face; as shown in FIGS. 6 and 7, dislocations in these directions converge inward. As a consequence, dislocations in the GaN crystal converge in the facet-plane boundaries 5M, and the dislocations (the advancing direction of which is $D_m$) in the facet plane boundaries 5M further converge in the facet-plane center point 5P, reducing the dislocations elsewhere. Moreover, dislocations having converged in the facet plane boundaries 5M and the facet plane center point 5P are quenched by their interactions with each other, and therefore, the dislocation density reduces as the GaN crystal grows. By such a mechanism, good quality GaN crystal is obtained, with its dislocation density being $1 \times 10^7$ cm$^{-2}$ or less.

The formation of facet-plane-defining pits on the crystal growth surface as described above is dependent on crystal growth conditions such as growth temperature, growth rate, and the partial pressure of the precursor gas. For example, the lower the growth temperature is, the more raised the growth rate is, and the more raised the partial pressure of the precursor gas is, the more the formation of the above-noted pits tends to be promoted.

In particular, in growing a GaN crystal by HVPE, in order to form the facet-plane-defining pits as described above, it is preferable that the growth temperature be about 850° C. to 1100° C., the growth rate be about 50 μm/hr to 200 μm/hr, the GaCl gas partial pressure be about 0.5 kPa to 4 kPa, and the NH$_3$ gas partial pressure be about 5 kPa to 50 kPa.

In the present invention the pit-size increase factor of the above-described pits is rendered 20% or less. Herein, the term "pit-size increase factor" means the proportion of increase in the pit diameter with respect to the thickness of the GaN crystal, and is defined, with reference to FIG. 1, by the following equation (1):

$$\text{pit-size increase factor (\%)} = 100 \times L/H \quad (1)$$

wherein the thickness of the GaN crystal is H (μm) and the pit size is L (μm).

Figure 5:
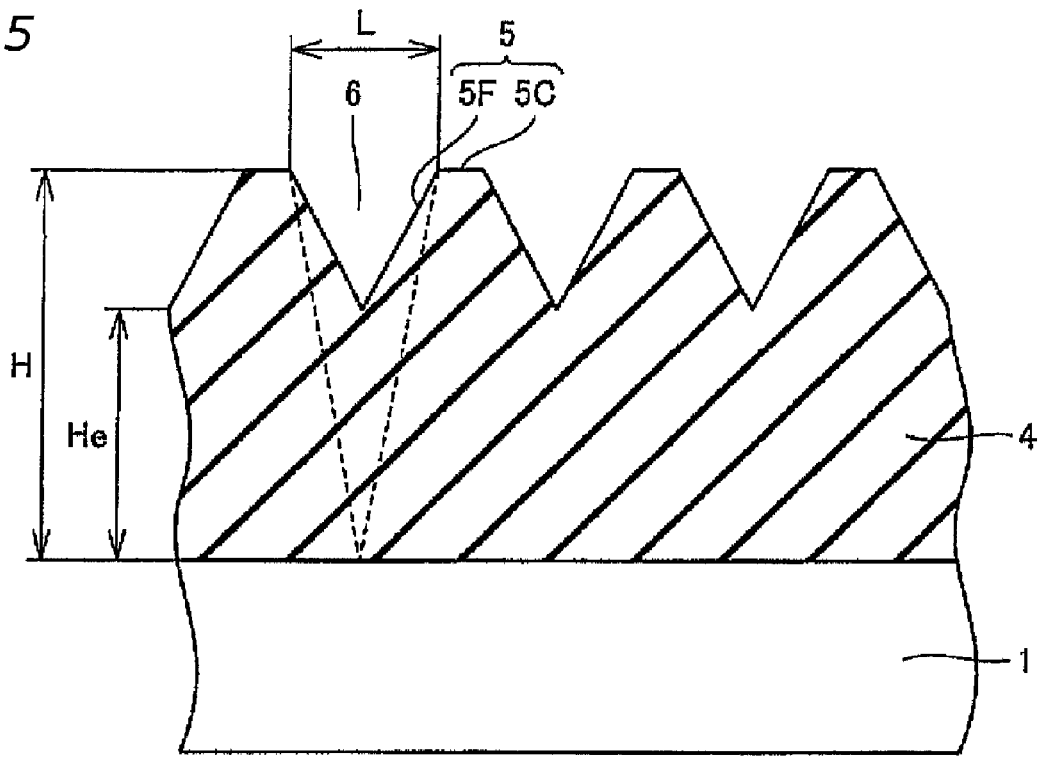
FIG. 5 is a schematic cross-sectional view illustrating a conventional method, in accordance with the present invention, of manufacturing a GaN crystal substrate.

By having the pit-size increase factor be 20% or less, more GaN crystal substrates can be obtained from a GaN crystal. For example, FIG. 1 depicts a GaN crystal 4 in which the pit-size increase factor is made to be 20% and FIG. 5 depicts a GaN crystal 4 in which the pit-size increase factor is made to be 40%. When both crystals are grown to the same thickness H (μm), the usable thickness He (μm) of the GaN crystal that can be removed as a GaN crystal substrate is larger in the GaN crystal of FIG. 1, which has a smaller pit-size increase factor. Given this result, it is preferable that the pit-size increase factor be rendered 10% or less. It should be understood that the term "pit-size increase factor" means the average value of the pit-size increase factor in the pits that are formed in the crystal growth surface in growing the GaN crystal.

Thus, it will be appreciated that the substrate acquisition rate improves with lessening pit-size increase factor, as demonstrated by the following equation (2), which defines the substrate acquisition rate (%):

$$\text{substrate acquisition rate (\%)} = 100 \times He/H \quad (2)$$

wherein when a GaN crystal is grown to a thickness of H (μm), the usable thickness of the GaN crystal that can be separated off as a GaN crystal substrate is He (μm).

Herein, referring to FIG. 6, reasons for the increase in pit diameter include the following: Letting the angle formed by the c-plane and a facet plane be θ, then if the growth rate $V_C$ of the c-plane with respect to the growth rate $V_F$ of the facet plane is $V_C > V_F \sin\theta$, and pits that have grown large coalesce to form still larger pits.

Accordingly, an effective technique to reduce the pit-size increase factor includes both reducing the growth rate of the c-plane with respect to the growth rate of a facet plane so that $V_C \leq V_F \sin\theta$, and not supplying the crystal growth energy at which the pits would coalesce. To achieve these results, it is preferable that the growth temperature for GaN crystal be 1000° C. or lower in the step of growing the GaN crystal. Reducing the growth temperature for the GaN crystal lowers the growth rate of the c-plane with respect to the growth rate of a facet plane and reduces crystal growth energy, which inhibits coalescence of the pits, thereby reducing the pit-size increase factor. By restricting the growth temperature for the GaN crystal to 1000° C. or lower, the pit-size increase factor can easily be made to be 20% or less. In light of this fact, the growth temperature for the GaN crystal is preferably 950° C. or lower, and still more preferably 900° C. or lower.

In conjunction with the lowering of the growth temperature for the GaN crystal, it is preferable that the growth rate of the GaN crystal be small. The growth rate of the GaN crystal should preferably be 150 μm/hr or less, more preferably 120 μm/hr or less, and still more preferably 100 μm/hr or less.

In view of reducing the growth rate of the GaN crystal, it is preferable that partial pressures of the source gases in growing the GaN crystal be small. With an HVPE technique, the GaCl gas partial pressure should preferably be from 0.5 kPa to 2.0 kPa or lower, and more preferably 0.5 kPa to 1.5 kPa. The NH$_3$ gas partial pressure should preferably be 5 kPa to 15 kPa, and more preferably 5 kPa to 10 kPa.

Figure 3:
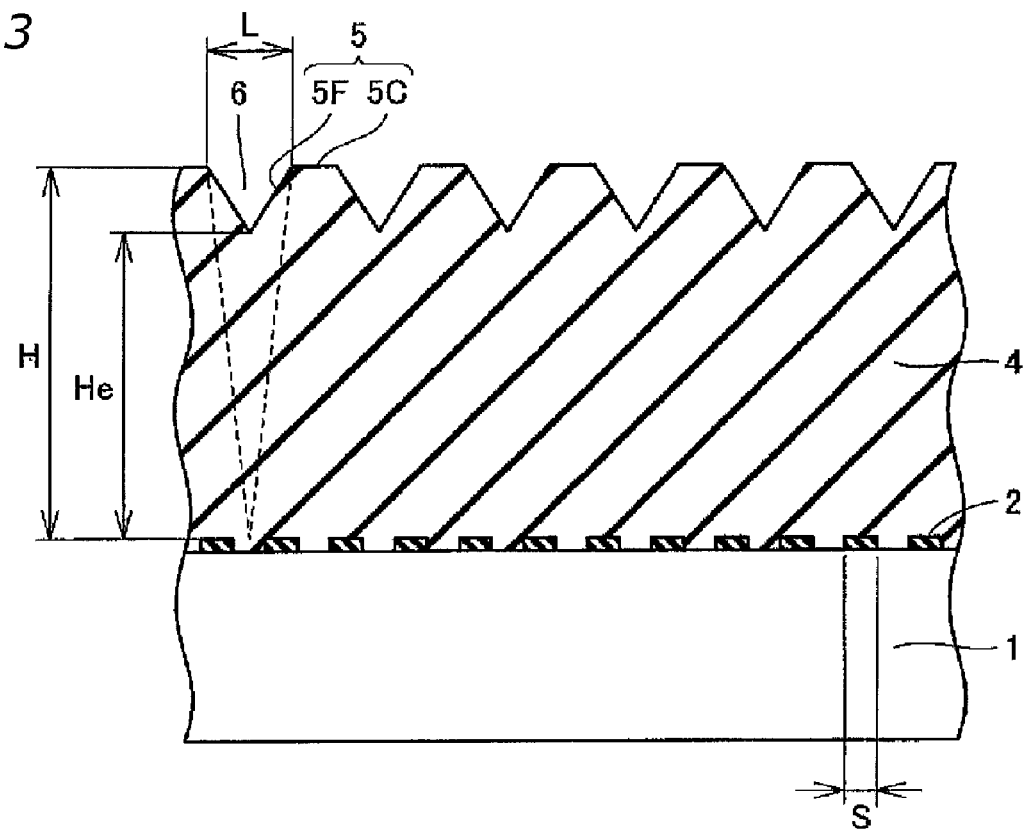
FIG. 3 is a schematic cross-sectional view illustrating yet another method, in accordance with the present invention, of manufacturing a GaN crystal substrate.

With reference to FIG. 3, another method, according to the present invention, of manufacturing a GaN crystal substrate is a method that includes a step of forming on a growth substrate 1 a mask layer 2 that defines aperture windows, and a step of growing a GaN crystal 4 on the mask layer 2 by a vapor growth technique; in the step of growing the GaN crystal 4, pits 6 are formed, each having facet planes 5F in a crystal growth surface 5A and the pit-size increase factor of the pits 6 is made to be 20% or less. By growing a GaN crystal on the mask layer formed on the growth substrate and by having an aperture-window-defining mask layer, the GaN crystal starts to grow from the portions of the growth substrate 1 that are exposed in the aperture windows of the mask layer 2; in this manner, the mask layer functions to suppress the growth of the GaN crystal in the areas that are not exposed in the aperture windows, and the GaN crystal in the remaining areas grows so as to cover the mask layer. This method lessens the adverse effects of dislocations in the growth substrate, and further reduces dislocations in the GaN crystal.

Figure 4:
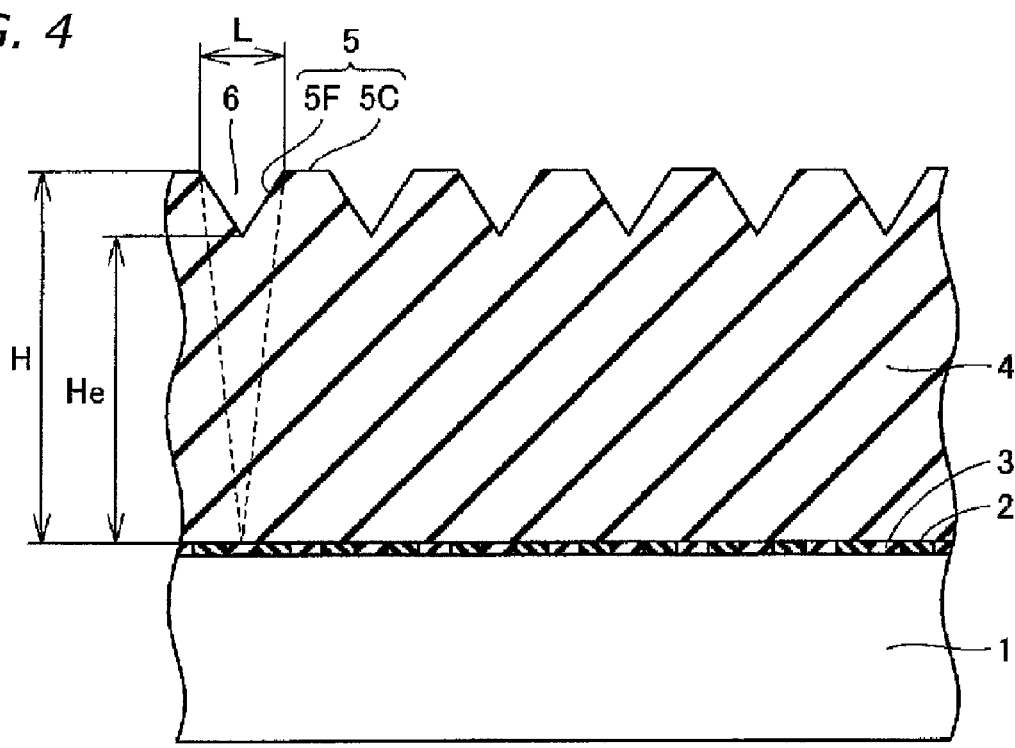
FIG. 4 is a schematic cross-sectional view illustrating still another method, in accordance with the present invention, of manufacturing a GaN crystal substrate.

In this case as well, preferable examples of the growth substrate include, but are not particularly limited to, a GaN substrate, which is a native substrate that is free from lattice mismatches with the GaN crystal, and foreign substrates that have small lattice mismatches, such as a sapphire substrate and a SiC substrate. Referring to FIG. 4, in cases in which a foreign substrate such as a sapphire substrate or a SiC substrate is used as the growth substrate, after the step of forming on the growth substrate 1 an aperture-window-defining mask layer 2 it is preferable to firstly form by vapor deposition a GaN buffer layer 3 that is an amorphous layer of GaN on the growth substrate 1 exposed in the aperture windows of the mask layer 2; thereafter, in the step of growing, by a vapor growth technique, the GaN crystal over the aperture-window-defining mask layer 2, it is preferable to grow a GaN crystal 4 by a vapor growth technique over both the GaN buffer layer 3 and the mask layer 2 for the purposes of alleviating lattice mismatches and reducing the dislocation density of the GaN crystal.

The aperture-window-defining mask layer is formed by coating the growth substrate with a mask material and thereafter forming the aperture windows by photolithography. Herein, examples of the mask material include $SiO_2$ and $Si_3N_4$.

Also, there are no restrictions on the way in which the aperture windows of the mask layer are provided, and it is possible to employ either a dotted pattern or a striped pattern. The dotted pattern refers to one in which isolated dots having a circular shape, a square shape, or the like are distributed regularly; when growing the GaN crystal along the c-plane orientation, it is preferable that three adjacent aperture windows be arranged to sit at the vertexes of equilateral triangles. The striped pattern refers to one in which a multiplicity of striplike covering portions and aperture window portions are provided alternately.

With reference to FIG. 3, although there are no restrictions on the distance S between adjacent aperture windows in the mask layer 2, it is preferable that the distance S be 2 μm or greater, and more preferably 4 μm or greater, from the viewpoint of reducing coalescence of the pits and controlling increase in pit diameter.

EMBODIMENT EXAMPLES

Examples 1 through 4, Comparative Example 1

With reference to FIG. 1, the growing of a GaN crystal 4 was carried out by an HVPE technique using a GaN substrate, which is a native substrate, as a growth substrate 1. The HVPE equipment utilized in the present examples was provided with a boat, disposed inside a reactor, in which Ga metal is accommodated, and was configured to enable introducing HCl gas and a carrier gas directed toward the boat, and, with the growth substrate placed below the boat, to enable introducing $NH_3$ gas and a carrier gas in the vicinity of the growth substrate. A heater was provided on the periphery of the reactor so that the boat and the growth substrate could be heated. An exhaust port is provided below the reactor, and the pressure is reduced by a vacuum pump. A Ga melt in the boat that is heated at 850° C. or higher reacts with the HCl gas, creating a GaCl gas, which reacts with the $NH_3$ gas, making it possible to grow a GaN crystal on the growth substrate. The carrier gas used here was a $H_2$ gas.

With the HVPE technique, GaN crystals were grown to a thickness of about 2 mm on growth substrates at the growth temperatures, GaCl partial pressures, $NH_3$ partial pressures, and growth rates set forth in Table I. Then, the GaN crystals were sliced with a wire saw or an internal-diameter saw and the surfaces were polished to obtain GaN crystal substrates of predetermined thickness. The dislocation densities, pit-size increase factors, and substrate acquisition rate of the GaN crystals are summarized in Table I.

Examples 5 through 8, Comparative Example 2

With reference to FIG. 3, using GaN substrates, which are native substrates, as the growth substrate 1, aperture-window-defining mask layers 2 were formed on the growth substrates, followed by growing GaN crystals 4 over the mask layers 2 by an HVPE technique.

Each aperture-window-defining mask layer was formed by forming a 100 nm-thick $SiO_2$ layer by CVD, and thereafter forming by photolithography aperture windows that are arrayed in a dotted pattern in which three adjacent aperture windows (squares 2 μm to a side) sit at the vertexes of equilateral triangles (the distance between the adjacent aperture windows being 4 μm).

By an HVPE technique, GaN crystals were grown to a thickness of about 2 mm on growth substrates at the growth temperatures, GaCl partial pressures, $NH_3$ partial pressures, and growth rates set forth in Table I. Then, the GaN crystals were sliced with a wire saw or an internal-diameter saw and the surfaces were polished to obtain GaN crystal substrates having a predetermined thickness. The dislocation densities, pit-size increase factors, and substrate acquisition rates of the GaN crystals are summarized in Table 1.

TABLE I

|  | Ex. 1 | Ex. 2 | Ex. 3 | Ex. 4 | Comp. Ex. 1 | Ex. 5 | Ex. 6 | Ex. 7 | Ex. 8 | Comp. Ex. 2 |
|---|---|---|---|---|---|---|---|---|---|---|
| Base substrate | GaN | GaN | GaN | GaN | GaN | GaN | GaN | GaN | GaN | GaN |
| Mask layer present? | N | N | N | N | N | Y | Y | Y | Y | Y |

TABLE I-continued

|  |  | Ex. 1 | Ex. 2 | Ex. 3 | Ex. 4 | Comp. Ex. 1 | Ex. 5 | Ex. 6 | Ex. 7 | Ex. 8 | Comp. Ex. 2 |
|---|---|---|---|---|---|---|---|---|---|---|---|
| GaN buffer layer present? | | N | N | N | N | N | N | N | N | N | N |
| GaN crystal | Growth temp. (° C.) | 900 | 950 | 950 | 1000 | 1050 | 900 | 950 | 950 | 1000 | 1050 |
| | GaCl partial pressure (kPa) | 1.5 | 1.5 | 2 | 2 | 3 | 1.5 | 1.5 | 2 | 2 | 3 |
| | NH$_3$ partial pressure (kPa) | 10 | 10 | 15 | 15 | 30 | 10 | 10 | 15 | 15 | 30 |
| | Growth rate (μm/hr) | 30 | 50 | 75 | 100 | 180 | 30 | 50 | 75 | 100 | 180 |
| | Dislocation density (×10$^6$ cm$^{-2}$) | 5 | 1 | 0.5 | 0.3 | 0.1 | 20 | 5 | 4 | 2 | 1 |
| | Pit dia. increase (%) | 5 | 10 | 15 | 20 | 30 | 5 | 10 | 15 | 20 | 30 |
| | Substrate acquisition rate (%) | 96 | 91 | 87 | 83 | 74 | 96 | 91 | 87 | 83 | 74 |

Examples 9 through 12, Comparative Example 3

With reference to FIG. 3, using GaAs substrates, which are foreign substrates, as the growth substrate 1, GaN buffer layers 3 were formed on the growth substrates, followed by growing GaN crystals 4 thereon.

For the GaN buffer layers 3, amorphous layers having a thickness of about 70 nm were formed, using an HVPE technique, by heating and holding the growth substrate 1 to 500° C. at a GaCl partial pressure of 0.2 kPa and a NH$_3$ partial pressure of 15 kPa.

With an HVPE technique, GaN crystals were grown to a thickness of about 2 mm over the GaN buffer layers 3 at the growth temperatures, GaCl partial pressures, NH$_3$ partial pressures, and growth rates set forth in Table II. Then, the GaAs substrates were removed by etching in aqua regia, and thereafter the GaN crystals were sliced with a wire saw or an internal-diameter saw and their surfaces polished to obtain GaN crystal substrates having a predetermined thickness. The dislocation densities, pit-size increase factors, and substrate acquisition rates of the GaN crystals are summarized in Table II.

Examples 13 through 16, Comparative Example 4

With reference to FIG. 3, using GaAs substrates, which are foreign substrates, as the growth substrate 1, aperture-window-defining mask layers 2 were formed on the growth substrates, and thereafter GaN buffer layers 3 were formed over the mask layers, followed by growing GaN crystals 4 thereon.

Each of the aperture-window-defining mask layers 2 was formed in the same manner as the mask layers in Examples 4 through 6. Each of the GaN buffer layers 3 were formed in the same manner as the buffer layers in Examples 7 through 9.

With an HVPE technique, GaN crystals were grown to a thickness of about 2 mm over the GaN buffer layers 3 at the growth temperatures, GaCl partial pressures, NH$_3$ partial pressures, and growth rates set forth in Table II. Then, the GaAs substrates were removed by etching in aqua regia, and thereafter, the GaN crystals were sliced with a wire saw or an internal-diameter saw and their surfaces polished to obtain GaN crystal substrates having a predetermined thickness. The dislocation densities, pit-size increase factors, and substrate acquisition rates of the GaN crystals are summarized in Table II.

TABLE II

|  |  | Ex. 9 | Ex. 10 | Ex. 11 | Ex. 12 | Comp. Ex. 3 | Ex. 13 | Ex. 14 | Ex. 15 | Ex. 16 | Comp. Ex. 4 |
|---|---|---|---|---|---|---|---|---|---|---|---|
| | Base substrate | GaAs | GaAs | GaAs | GaAs | GaAs | GaAs | GaAs | GaAs | GaAs | GaAs |
| | Mask layer present? | N | N | N | N | N | Y | Y | Y | Y | Y |
| | GaN buffer layer present? | Y | Y | Y | Y | Y | Y | Y | Y | Y | Y |
| GaN crystal | Growth temp. (° C.) | 900 | 950 | 950 | 1000 | 1050 | 900 | 950 | 950 | 1000 | 1050 |
| | GaCl partial pressure (kPa) | 1.5 | 1.5 | 2 | 2 | 3 | 1.5 | 1.5 | 2 | 2 | 3 |
| | NH$_3$ partial pressure (kPa) | 10 | 10 | 15 | 15 | 30 | 10 | 10 | 15 | 15 | 30 |
| | Growth rate (μm/hr) | 30 | 50 | 75 | 100 | 180 | 30 | 50 | 75 | 100 | 180 |
| | Dislocation density (×10$^6$ cm$^{-2}$) | 1000 | 200 | 100 | 50 | 20 | 50 | 10 | 5 | 3 | 1 |

TABLE II-continued

|  | Ex. 9 | Ex. 10 | Ex. 11 | Ex. 12 | Comp. Ex. 3 | Ex. 13 | Ex. 14 | Ex. 15 | Ex. 16 | Comp. Ex. 4 |
|---|---|---|---|---|---|---|---|---|---|---|
| Pit dia. increase (%) | 5 | 10 | 15 | 20 | 30 | 5 | 10 | 15 | 20 | 30 |
| Substrate acquisition rate (%) | 96 | 91 | 87 | 83 | 74 | 96 | 91 | 87 | 83 | 74 |

As is evident from Tables I and II, the substrate acquisition rate was 83% or higher at a pit-size increase factor of 20% or less, and was 91% or higher at a pit-size increase factor of 10% or less, which proves that reducing the pit-size increase factor improves the substrate acquisition rate. Moreover, the provision of the aperture-window-defining mask layer further reduced dislocations in the GaN crystal.

As described in the foregoing, because the present invention efficiently yields a great amount GaN crystal substrate, it will find broad utilization as a method of manufacturing GaN crystal substrates.

The presently disclosed embodiments and implementation examples should in all respects be considered to be illustrative and not limiting. The scope of the present invention is set forth not by the foregoing description but by the scope of the patent claims, and is intended to include meanings equivalent to the scope of the patent claims and all modifications within the scope.

What is claimed is:

1. A method of manufacturing GaN crystal substrate, comprising:

a step of forming an aperture-window-defining mask layer onto a growth substrate;

a step of growing onto the mask layer GaN crystal by a hydride vapor-phase epitaxy employing GaCl and $NH_3$ source gases; and a step, in said step of growing GaN crystal, of controlling the partial pressure of the GaCl source gas to be from 0.5 kPa to 1.5 kPa, the partial pressure of the $NH_3$ source gas to be from 5.0 kPa to 10 kPa, and the crystal-growth temperature to a predetermined value; wherein the GaCl and $NH_3$ source-gas partial pressures are controlled, and the crystal-growth temperature is predetermined so as to form in the crystal-growth surface facet-plane-defining pits that enlarge diametrically as the crystal grows, yet such that the pit-size increase factor of the pits is in the range of from 5% to 20%, and letting the growth rate of the c-plane be $V_c$ and the growth rate of the facet plane be $V_F$, such that $V_c \leq V_F \sin \theta$, whereby the pits in the crystal-growth surface do not coalesce.

2. A GaN-crystal-substrate manufacturing method as set forth in claim 1, wherein the crystal-growth temperature is 1000° C. or less.

* * * * *